United States Patent
Suzuki (10) Patent No.: US 7,911,258 B2
(45) Date of Patent: Mar. 22, 2011

(54) SEMICONDUCTOR INTEGRATED CIRCUIT DEVICE, REDUNDANCY SYSTEM, AND REDUNDANCY METHOD FOR LATCHING AND TRANSMITTING FUSE DATA

(75) Inventor: Atsushi Suzuki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 146 days.

(21) Appl. No.: 12/208,837

(22) Filed: Sep. 11, 2008

(65) Prior Publication Data

US 2009/0072886 A1 Mar. 19, 2009

(30) Foreign Application Priority Data

Sep. 14, 2007 (JP) ................. 2007-239763

(51) Int. Cl.
*G11C 7/00* (2006.01)
*G11C 11/40* (2006.01)
(52) U.S. Cl. ...................... 327/525; 365/200
(58) Field of Classification Search .................. None
See application file for complete search history.

(56) References Cited

U.S. PATENT DOCUMENTS

| | | | |
|---|---|---|---|
| 5,862,097 A | 1/1999 | Toda | |
| 6,542,419 B2 | 4/2003 | Hasegawa | |
| 6,577,156 B2 | 6/2003 | Anand et al. | |
| 6,707,746 B2 | 3/2004 | Frankowsky et al. | |
| 6,757,204 B2 * | 6/2004 | Di Ronza et al. | 365/200 |
| 6,937,533 B2 * | 8/2005 | Hojo et al. | 365/200 |
| 7,016,247 B2 | 3/2006 | Murakuki et al. | |
| 7,038,969 B2 | 5/2006 | Hamada et al. | |
| 7,330,383 B2 * | 2/2008 | Takai | 365/200 |
| 2006/0274586 A1 | 12/2006 | Takai et al. | |
| 2009/0049348 A1 * | 2/2009 | Iwai | 714/718 |

FOREIGN PATENT DOCUMENTS

| | | |
|---|---|---|
| JP | 2002-74980 | 3/2002 |
| JP | 2002-261599 | 9/2002 |
| JP | 2005-116151 | 4/2005 |
| JP | 2005-196878 | 7/2005 |
| JP | 2006-185569 | 7/2006 |

* cited by examiner

*Primary Examiner* — Lincoln Donovan
*Assistant Examiner* — Terry L Englund
(74) *Attorney, Agent, or Firm* — Oblon, Spivak, McClelland, Maier & Neustadt, L.L.P.

(57) ABSTRACT

A semiconductor integrated circuit device including a fuse latch circuit including a fuse and a latch circuit for latching fuse data held in the fuse, a fuse counter circuit for counting the number of transfers of the fuse data, and a control circuit including a transmitter circuit for transmitting the fuse data to a memory macro connected to the control circuit, and a detour data path circuit which when the fuse data is not transferred, does not transfer the fuse data to the memory macro, and forms a detour data path for detouring the fuse data in the detour data path circuit itself.

17 Claims, 10 Drawing Sheets

SEMICONDUCTOR INTEGRATED CIRCUIT DEVICE, REDUNDANCY SYSTEM, AND REDUNDANCY METHOD FOR LATCHING AND TRANSMITTING FUSE DATA

CROSS-REFERENCE TO RELATED APPLICATIONS

This application is based upon and claims the benefit of priority from prior Japanese Patent Application No. 2007-239763, filed Sep. 14, 2007, the entire contents of which are incorporated herein by reference.

BACKGROUND OF THE INVENTION

1. Field of the Invention

The present invention relates to a semiconductor circuit device, a redundancy system, and a redundancy method thereof, and is applied to, for example, a fuse box, and the like.

2. Description of the Related Art

Heretofore, as a device for performing a redundancy operation with respect to a memory macro, there is a fuse box for retaining and transferring redundancy information (see, for example, Jpn. Pat. Appln. KOKAI Publication No. 2006-185569). The fuse box is constituted of, for example, a fuse latch circuit including a fuse and a circuit for latching fuse data, a fuse counter circuit for counting the number of transfers of fuse data, and a control circuit for controlling a signal of fuse data.

For example, a redundancy operation performed by the fuse box is started when the fuse counter circuit receives a request signal (REQ) from the control circuit in accordance with a demand signal (ACKS/D) from an external memory macro. Subsequently, upon receipt of the request signal (REQ), the control circuit acquires fuse data from the fuse latch circuit, and transfers the fuse data to the outside as fuse data (FOUTS/D). As described above, the above operation is repeated, fuse data in the fuse latch circuit is successively transferred, and when the number of transfers counted by the fuse counter circuit reaches a predetermined number, the transfer of the fuse data is terminated.

In performing the redundancy operation as described above, the conventional fuse box is configured in such a manner that unless the fuse data (FOUTS/D) is transmitted as asynchronous data, a request signal (REQ) for requesting the next fuse data cannot be operated. Thus, the conventional fuse box is configured in such a manner that the detour operation of the fuse data in which transfer of fuse data from the fuse latch circuit is performed, but transfer of fuse data (Fouts/D) from the fuse box to the outside is not performed cannot be performed. As a result of this, the conventional fuse box has a tendency to reduce the convenience.

BRIEF SUMMARY OF THE INVENTION

A semiconductor integrated circuit device according to an aspect of the present invention comprising a fuse latch circuit including a fuse and a latch circuit for latching fuse data held in the fuse;

a fuse counter circuit for counting the number of transfers of the fuse data; and a control circuit including a transmitter circuit for transmitting the fuse data to the outside, and a detour data path circuit which when the fuse data is not transferred, does not transfer the fuse data to the outside, and forms a detour data path for detouring the fuse data in the circuit itself.

A redundancy system according to another aspect of the present invention comprising a fuse box provided with a fuse latch circuit including a fuse and a latch circuit for latching fuse data held in the fuse, a fuse counter circuit for counting the number of transfers of the fuse data, and a control circuit including a transmitter circuit for transmitting the fuse data to the outside, and a detour data path circuit which when the fuse data is not transferred, does not transfer the fuse data to the outside, and forms a detour data path for detouring the fuse data in the circuit itself; and a memory macro which replaces existing data thereof with the fuse data transmitted from the fuse box to thereby save the data of the memory macro's own.

A redundancy method of a redundancy system according to still another aspect of the present invention comprising reading fuse data in a fuse latch circuit, and holding the data in the fuse latch circuit;

increasing the counted number in a fuse counter circuit by one;

causing the fuse counter circuit to output a control signal in a first state to a control circuit when fuse data is to be transferred to a detour data path in the control circuit;

causing the control circuit, when the control signal in the first state is received, to pass the fuse data through the detour data path without transferring the fuse data to the memory macro;

causing the control circuit to make the fuse counter circuit operate a request signal for requesting the next fuse data from the fuse latch circuit; and causing the fuse counter circuit to increase the counted number in the fuse counter circuit by one by the request signal.

DETAILED DESCRIPTION OF THE INVENTION

[Outline]

First, an outline of the present invention will be described below with reference to FIG. 1.

In the example of the present invention, a semiconductor integrated circuit device and a redundancy system which can perform the detour operation of the fuse data in which transfer of fuse data is performed, but transfer (data output) of fuse data from the fuse box to the outside is not performed, and can improve the convenience is proposed.

Figure 1:
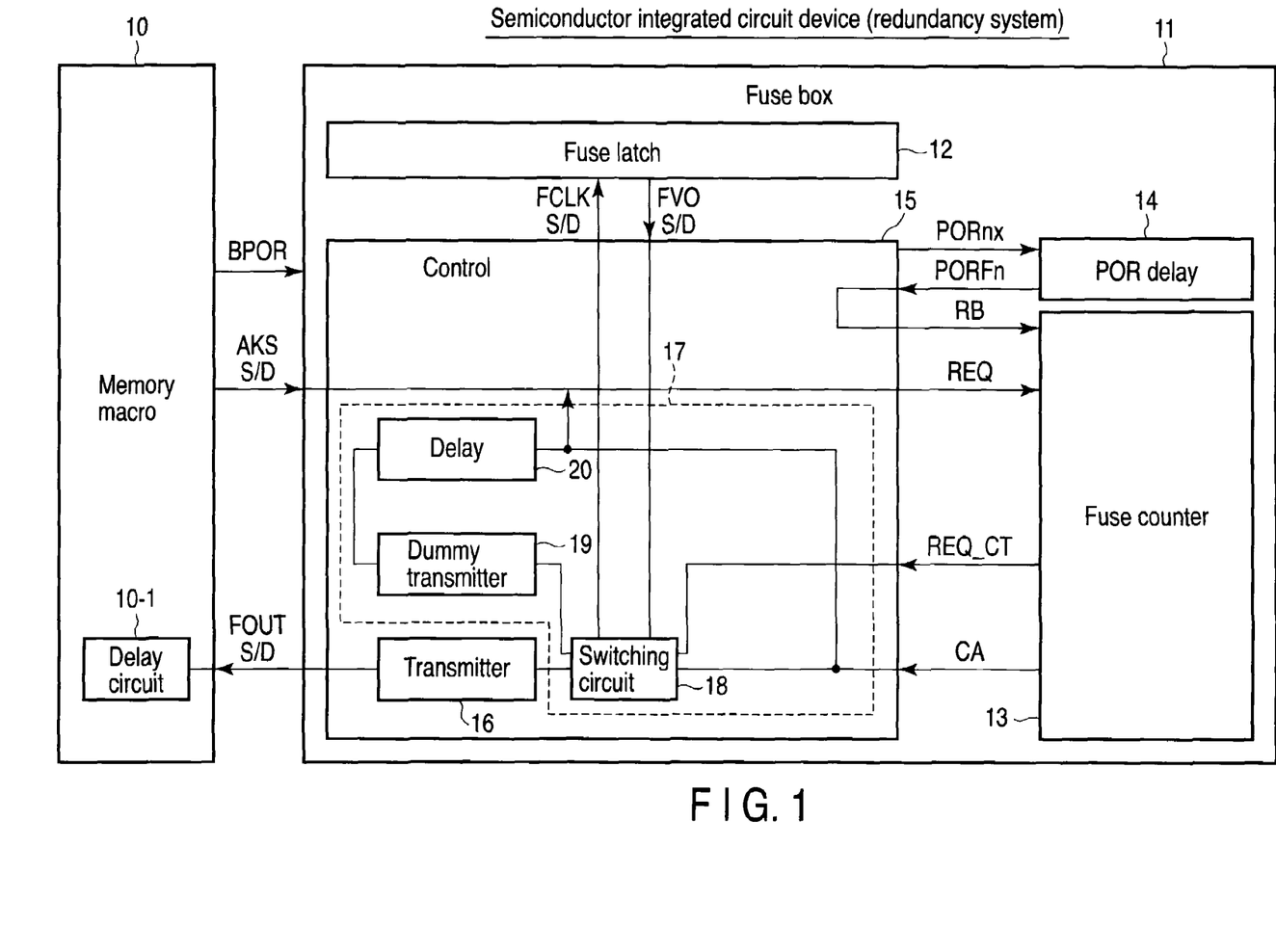
FIG. 1 is an overall block diagram for explaining an outline of a semiconductor integrated circuit device and a redundancy system of the present invention.

For example, as shown in FIG. 1, a fuse box 11 is proposed in which a detour data path used, when fuse data is not transferred, to operate a request signal REQ for requesting next fuse data even when fuse data is not transferred, is present in a control circuit 15, and switching between a case where fuse data is transferred, and a case where fuse data is not transferred, therefore data is passed through a detour path, is controlled by a control signal CA output from a fuse counter circuit 13.

The configuration of the fuse box 11 includes, as shown in FIG. 1, a fuse latch circuit 12 including a fuse and a latch circuit for latching fuse data held in the fuse, a fuse counter circuit 13 for counting the number of transfers of the fuse data, and a control circuit including a transmitter circuit 16 for transmitting the fuse data to the outside, and a detour data path circuit 17 which when the fuse data is not transferred, does not transfer the fuse data to the outside, and forms a detour data path for detouring the fuse data in the circuit 17 itself. Further, the detour data path circuit 17 is a circuit which when the circuit 17 receives the control signal CA transmitted from the fuse counter circuit 13, causes the fuse counter circuit 13 to operate a request signal REQ for requesting the next fuse data from the fuse latch circuit 12.

Here, the number of transfers of the fuse data counted by the fuse counter circuit 13 implies the number of transfers of fuse data transmitted from the fuse latch circuit 12. Accordingly, the above number of transfers is different from the number of transfers of transferring (data output) fuse data from the fuse box 11 to the outside (memory macro 10).

According to the configuration described above, the fuse box 11 is provided with the control circuit 15 including the detour data path circuit 17 which when the fuse data is not transferred, forms a detour data path for detouring the fuse data in the circuit 17 itself without transferring the fuse data to the outside. Further, upon receipt of the control signal CA transmitted from the fuse counter circuit 13, the detour data path circuit 17 can cause the fuse counter circuit 13 to operate the request signal REQ for requesting the next fuse data from the fuse latch circuit 12.

Therefore, it is possible to operate the request signal REQ for requesting the next fuse data without transferring the fuse data FOUTS/D to the memory macro (outside). As a result of this, it is possible to perform the detour operation of the fuse data in which transfer of fuse data from the fuse latch circuit 12 is performed, but transfer of fuse data (FOUTS/D) from the fuse box 11 to the memory macro (outside) is not performed, and improve the convenience.

In addition to the above, in the operation from receiving the request signal REQ_CT transmitted from the fuse counter circuit 13 up to transmitting the fuse data from the fuse latch circuit 12, a common switching circuit 18 can be used in both the case where the fuse data is transferred, and the case where the fuse data is not transferred, therefore the data is passed through the detour data path. Thus, the size of the circuit of the fuse box 11 can be made small. Furthermore, by controlling a delay of a signal passed through the detour data path by a delay circuit 20, the operation cycle of the fuse box 11 in the case where the data is transferred, and that in the case where the data is not transferred can be made closer to each other, which is advantageous.

Further, the control signal CA is output from the fuse counter circuit 13, whereby, after the control signal CA has performed control in the control circuit 15, a signal obtained by delaying the request signal REQ can perform a function of the operation clock of the control circuit 15, and the latching control of the signals can be made easy, which is also advantageous.

Incidentally, to the memory macro 10 which is the object of the redundancy operation, for example, a static random access memory (SRAM), dynamic random access memory (DRAM), and the like can be applied. However, the type of memory that can be applied to the memory macro is not limited to the above. The memory macro 10 is provided with at least a delay circuit 10-1 to which the fuse data FOUTS/D is input.

Some embodiments considered to be the best and a comparative example will be described below. Further, in each of the following embodiments and example, a fuse box will be described as an example. In the description, common parts are denoted by common reference symbols throughout all the drawings.

First Embodiment

<1. Example of Overall Configuration>

First, an example of the overall configuration of a semiconductor integrated circuit device and a redundancy system according to a first embodiment of the present invention will be described below with reference to FIG. 1.

As shown in FIG. 1, a fuse box 11 according to this example is constituted of a fuse latch circuit 12, a delay circuit 14, a fuse counter circuit 13, and a control circuit 15.

The fuse latch circuit 12 includes, as will be described later, a fuse (not shown), and a latch circuit (not shown) for latching fuse data held in the fuse.

The delay circuit 14 is a circuit for switching the fuse counter circuit 13 which has been in the reset state to the normal state in order to start transfer of fuse data. That is, when the level of a signal BPOR transmitted from the memory macro is switched, the delay circuit 14 transfers a signal PORFn to the control circuit 15. Subsequently, when the control circuit 15 switches the level of a signal RB, the fuse counter circuit 13 which has been in the reset state is brought into the normal state.

1-1. Configuration Example of Fuse Counter Circuit

The fuse counter circuit 13 is a circuit for counting the number of transfers of fuse data. In the case of this example (shown in FIG. 2), the fuse counter circuit 13 is constituted of RQ SWs 22 to 24, an RQ terminal 25, a buffer 26, and fuse counters (a row fuse counter, column fuse counter, and trim fuse counter) 27 to 29.

Figure 2:
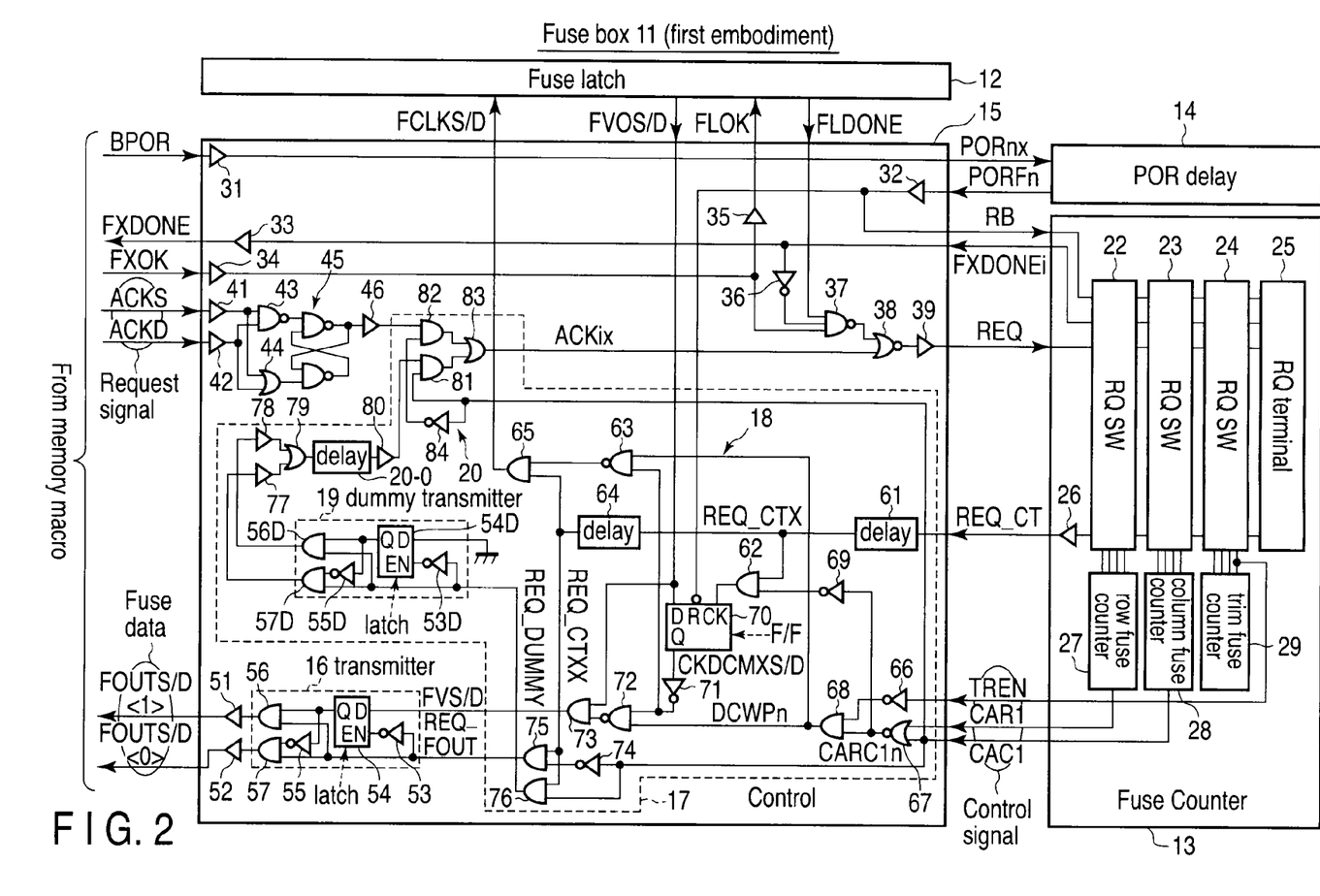
FIG. 2 is a diagram showing an example of an overall configuration of a semiconductor integrated circuit device according to a first embodiment of the present invention.

In the RQ SWs 22 to 24, and RQ terminal 25, input sections are connected to the control circuit 15, and output sections are connected to the control circuit 15 and the buffer 26. That is, when the signal RB is input, the RQ SWs 22 to 24, and the RQ terminal 25 are switched to the normal state. When the request signal REQ is input, the RQ SWs 22 to 24, and the RQ terminal 25 output a signal which will become the request signal REQ_CT to the input section of the buffer 26.

In the buffer 26, the input section thereof is common-connected to the RQ SWs 22 to 24, and the RQ terminal 25, and the output section thereof is connected to the input section of the delay circuit 61 (shown in FIG. 2) of the control circuit 15. Further, the buffer 26 amplifies the output from the RQ SWs 22 to 24, and the RQ terminal 25, and outputs the amplified output to the control circuit 15 as the request signal REQ_CT.

An input section of the fuse counter (row fuse counter) 27 is connected to the RQ SW 22, and an output section thereof is connected to an input section of a NOR gate 67 (shown in FIG. 2). The fuse counter 27 is used to transmit a control signal CAR1 to the input section of the NOR gate 67.

An input section of the fuse counter (column fuse counter) 28 is connected to the RQ SW 23, and an output section thereof is connected to the input section of the NOR gate 67. The fuse counter 28 is used to transmit a control signal CAC1 to the input section of the NOR gate 67.

An input section of the fuse counter (trim fuse counter) 29 is connected to the RQ SW 24, and a part of the input section thereof is connected to an input section of an inverter 66 (shown in FIG. 2).

1-2. Configuration Example of Control Circuit

The control circuit 15 is constituted of a transmitter circuit 16 and other circuits, and a detour data path circuit 17.

1-2-1. Transmitter Circuit and the Like

The transmitter circuit 16 is a circuit for transmitting fuse data FOUTS/D <0> and FOUTS/D <1> to the memory macro (not shown). Input sections of the transmitter circuit 16 are connected to the detour data path circuit 17, and output sections thereof are connected to input sections of buffers 51 and 52 (shown in FIG. 2). The buffers 51 and 52 amplify outputs of the transmitter circuit 16, and transmit the amplified outputs to the memory macro as the fuse data FOUTS/D <0> and FOUTS/D <1>.

As shown in FIG. 2, the transmitter circuit 16 is constituted of inverters 53 and 55, a flip-flop 54, and AND gates 56 and 57. The input section of the inverter 53 is connected to an output section (signal REQ_FOUT) of the detour data path circuit 17, and the output section thereof is connected to an input section (clock input EN) of the flip-flop 54. An input section of the inverter 55 is connected to an output section (data output Q) of the flip-flop 54, and an output section thereof is connected to an input section of the AND gate 57.

An input section (data input D) of the flip-flop 54 is connected to an output section (signal FVS/D) of the detour data path circuit 17.

An input section of the AND gate 56 is connected to the output section (signal REQ_FOUT) of the detour data path circuit 17, and an output section thereof is connected to an input section of the buffer 51.

An input section of the AND gate 57 is connected to the output section (signal REQ_FOUT) of the detour data path circuit 17, and an output section thereof is connected to an input section of the buffer 52.

An input of a buffer 31 as the other circuit is connected to an output section (signal BPOR) of the memory macro, and an output section thereof is connected to an input section (signal PORnx) of the delay circuit 14.

An input section of a buffer 32 is connected to an output section (signal PORFn) of the delay circuit 14, and an output section thereof is connected to an input section (RB) of the fuse counter circuit 13.

An input section of a buffer 33 is connected to an output section (signal FXDONEi) of the fuse counter circuit 13, and an output section thereof is connected to an input section (FXDONE) of the memory macro.

An input section of a buffer 34 is connected to an output section (signal FXOK) of the memory macro, and an output section thereof is connected to an input section of a NAND gate 37.

An input section of the NAND gate is connected to an output section of an inverter 36, and an output section thereof is connected to an input section of a NOR gate 38.

An input section of the NOR gate 38 is connected to an output section (ACKix) of the detour data path circuit 17, and an output section thereof is connected to an input section of a buffer 39.

An output section of the buffer 39 is connected to an input section (request signal REQ) of the fuse counter circuit 13.

Input sections of buffers 41 and 42 are connected to output sections (request signals ACKS and ACKD) of the memory macro, and their output sections are connected to input sections of a NAND gate 43.

An output section of the NAND gate 43 is connected to an input section a flip-flop 45.

Input sections of an OR gate 44 are connected to the output sections of the buffers 41 and 42, and an output section thereof is connected to an input section of the flip-flop 45.

An output section of the flip-flop 45 is connected to an input section of a buffer 46.

An output section of the buffer 46 is connected to an input section of the detour data path circuit 17.

1-2-2. Detour Data Path Circuit

The detour data path circuit 17 is constituted of a switching circuit 18, a dummy transmitter circuit 19, and a delay circuit 20.

Here, the delay circuit 20 operates the request signal REQ with a predetermined delay. In the dummy transmitter circuit 19, output sections thereof are connected to the delay circuit 20. In the switching circuit 18, an input section thereof is connected to the fuse counter circuit 13, and when the control signal (TREN, CAR1, CAC1) is input thereto, fuse data transmitted thereto from the fuse latch circuit 12 is output to the dummy transmitter circuit 19 switched from the transmitter circuit 16.

The switching circuit is constituted of the following circuits.

That is, the input section of the delay circuit 61 is connected to the output section (REQ_CT) of the fuse counter circuit 13, and the output section (REQ_CTX) thereof is connected to input sections of an delay circuit 64 and an AND gate 62.

An input section of the AND gate 62 is connected to an output section of an inverter 69, and an output section thereof is connected to an input section (CK) of a flip-flop 70.

An input section of a NAND gate 63 is connected to an output section of an inverter 71, and an output section thereof is connected to an input section of an AND gate 65.

The input section of the inverter 66 is connected to the output section (control signal TREN) of the fuse counter circuit 13, and an output section thereof is connected to an input section of an AND gate 68.

The input sections of the NOR gate 67 are connected to the output sections (control signals CAR1 and CAC1) of the fuse counter circuit 13, and an output section thereof is connected to an input section of the AND gate 68.

An input section of the inverter 69 is connected to the output section of the NOR gate 67, and the output section thereof is connected to the input section of the AND gate 62.

An input section (R) of the flip-flop 70 is connected to the output section of the buffer 32, and a data input section D thereof is connected to an output section (FVOS/D) of the fuse latch circuit 12, and a data output section Q thereof is connected to an input section of the inverter 71.

The output section of the inverter 71 is connected to the input of the NAND gate 63 and an input section of a NAND gate 72.

An input section of an AND gate 73 is connected to an output section of the NAND gate 72, and an output section thereof is connected to the input section (FVS/D) of the transmitter circuit 16.

An input section of an inverter 74 is connected to the output section (control signal CAC1) of the fuse counter circuit 13, and an output section thereof is connected to an input section of an AND gate 75.

An input section of the AND gate 75 is connected to an output section (REQ_CTXX) of the delay circuit 64, and an output section thereof is connected to the input section (REQ_FOUT) of the transmitter circuit.

An input section of an AND gate 76 is connected to the input section of the inverter 74, and an output section thereof is connected to an input section (REQ_DUMMY) of the dummy transmitter circuit 19.

Next, the dummy transmitter circuit 19 has the same circuit configuration as the transmitter circuit 16 and is, specifically, constituted of the following circuits.

That is, the dummy transmitter circuit 19 is constituted of inverters 53D and 55D, a flip-flop 54D, and AND gates 56D and 57D.

An input section of the inverter 53D is connected to the output section (signal REQ_DUMMY) of the switching circuit 18, and an output section thereof is connected to an input section (clock input EN) of the flip-flop 54D.

An input section of the inverter 55D is connected to an output section (data output Q) of the flip-flop 54D, and an output section thereof is connected to an input section of the AND gate 57D.

An input section (data input D) of the flip-flop 54D is connected to the ground power source GND.

An input section of the AND gate 56D is connected to the output section (signal REQ_DUMMY) of the switching circuit 18, and an output section thereof is connected to an input section of a buffer 78.

An input section of the AND gate 57D is connected to the output section (signal REQ_DUMMY) of the switching circuit 18, and an output section thereof is connected to an input section of a buffer 77.

Next, the delay circuit 20 is constituted of the following circuits.

That is, the input sections of the buffers 77 and 78 are connected to the output sections of the dummy transmitter circuit 19, and their output sections are connected to input sections of an OR gate 79.

An input section of a delay circuit 20-0 is connected to an output section of the OR gate 79, and an output section thereof is connected to an input section of a buffer 80.

An output section of the buffer 80 is connected to an input section of an AND gate 81.

Input sections of the AND gate 81 are connected to the output section of the buffer 80, and the output section (CAC1) of the fuse counter circuit 13, and an output section thereof is connected to an input section of an OR gate 83.

Input sections of an AND gate 82 are connected to an output section of an inverter 84, and an output section of a buffer 46, and an output section thereof is connected to an input section of the OR gate 83.

1-3-1. Configuration Example of Fuse Latch Circuit

Next, a configuration example of a fuse latch circuit 12 will be described below with reference to FIG. 3.

Figure 3:
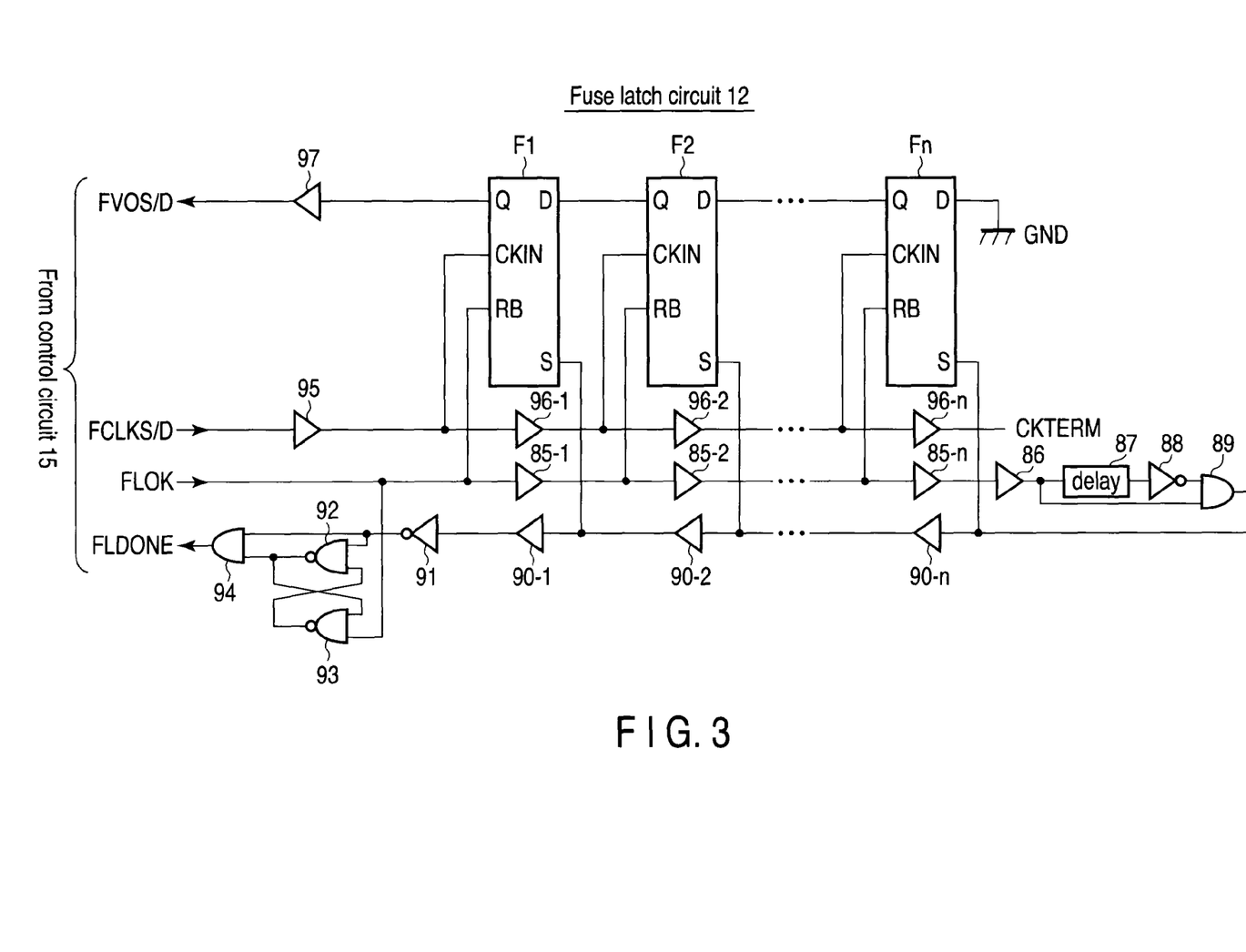
FIG. 3 is a circuit diagram showing a fuse latch circuit according to the first embodiment.

The fuse latch circuit is constituted of circuits shown in FIG. 3. That is, input sections (data D) and output sections (data Q) of a plurality of flip-flops F1 to Fn are connected in series between the ground power source GND and the input section of the buffer 97.

Input sections and output sections of a plurality of buffers 85-1 to 85-n are connected in series between the output section (FLOK) of the control circuit and the input section of the buffer 86. Further, each of input sections of the buffers 85-1 to 85-n is connected to each of input sections (RB) of the flip-flops F1 to Fn.

An output section of a buffer 86 is connected to an input section of a delay circuit 87, and an input section of an AND gate 89.

An output section of the delay circuit 87 is connected to an input section of an inverter 88.

Input sections and output sections of buffers 90-1 to 90-n are connected in series between an output section of the AND gate 89 and an input section of an inverter 91.

An output section of the buffer 91 is connected to an input section of a NAND gate 92.

An input section of the NAND gate 92 is connected to an output section of a NAND gate 93, and an output section thereof is connected to an input section of the NAND gate 93, and a input section of an AND gate 94.

An output section of the AND gate 94 is connected to an input section (FLDONE) of the control circuit 15.

An input section of the buffer 95 is connected to an input section (FCLKS/D) of the control circuit 15.

Input sections and output sections of a plurality buffers 96-1 to 96-n are connected in series between an output section of the buffer 95 and a signal CKTERM. Further, each of input sections (CKIN) of the flip-flops F1 to Fn is connected to each of input sections of the plural buffers 96-1 to 96-n.

1-3-2. Configuration Example of Main Part (Fuse Section) of Fuse Latch Circuit

Figure 4:
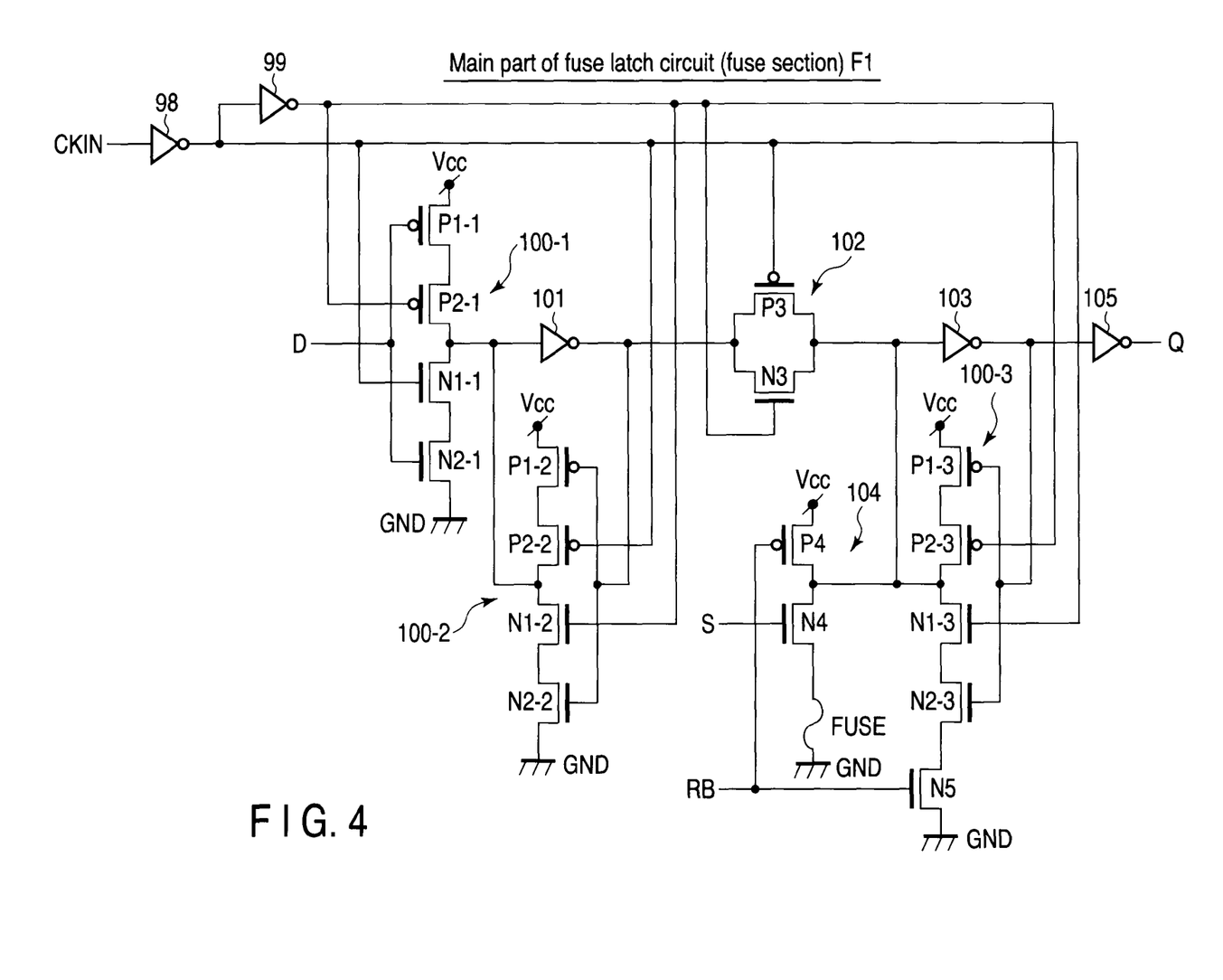
FIG. 4 is a circuit diagram showing a main part (fuse part) of the fuse latch circuit according to the first embodiment.

Next, a configuration example of a main part of the fuse latch circuit 12 will be described below with reference to FIG. 4. Here, the flip-flop F1 in FIG. 3 will be described as an example. The circuit configuration of the flip-flop F1 is as shown in FIG. 4.

That is, an input section of an inverter 98 is connected to an input section (CKIN) of the flip-flop F1, and an output section thereof is connected to an input section of an inverter 99, and gates of transistors N1-1, P2-2, P3, and N1-3.

An output section of the inverter 99 is connected to gates of transistors P2-1, N1-2, N3, and P2-3.

A clocked inverter 100-1 is constituted of transistors P1-1 to N2-1 which are connected in series and of which the current path is formed between the ground power source GND and the internal power source Vcc.

A transfer gate 102 is constituted of transistors P3 and N3. One end of each of current paths of the transistors P3 and N3 is connected to an output section of an inverter 101, and the other end of each of the current paths of the transistors is connected to an input section of an inverter 103.

An output section of the inverter 103 is connected to an input section of an inverter 105, and gates of transistors P1-3 and N2-3.

A clocked inverter 100-2 is constituted of transistors P1-2 to N2-2 which are connected in series and of which the current path is formed between the ground power source GND and the internal power source Vcc.

A clocked inverter 100-3 is constituted of transistors P1-3 to N2-3 which are connected in series and of which the current path is formed between the ground power source GND and the internal power source Vcc.

An inverter 104 is constituted of transistors P4 and N4 which are connected in series and of which the current path is formed between one end of a fuse and the internal power source Vcc. A gate of the transistor P4 is connected to an input section (RB) of the flip-flop Fl, and a gate of the transistor N4 is connected to an input section (S) of the flip-flop Fl.

The other end of the fuse is connected to the ground power source GND.

One end of a current path of a transistor N5 is connected to one end of a current path of the transistor N2-3, the other end thereof is connected to the ground power source GND, and a gate thereof is connected to the input section (RB) of the flip-flop Fl.

An output section of the inverter 105 is connected an output section (data output Q) of the flip-flop Fl.

1-3-3. Operation of Fuse Latch Circuit

Next, an operation of the fuse latch circuit according to this example will be described below in accordance with FIG. 5.

Figure 5:
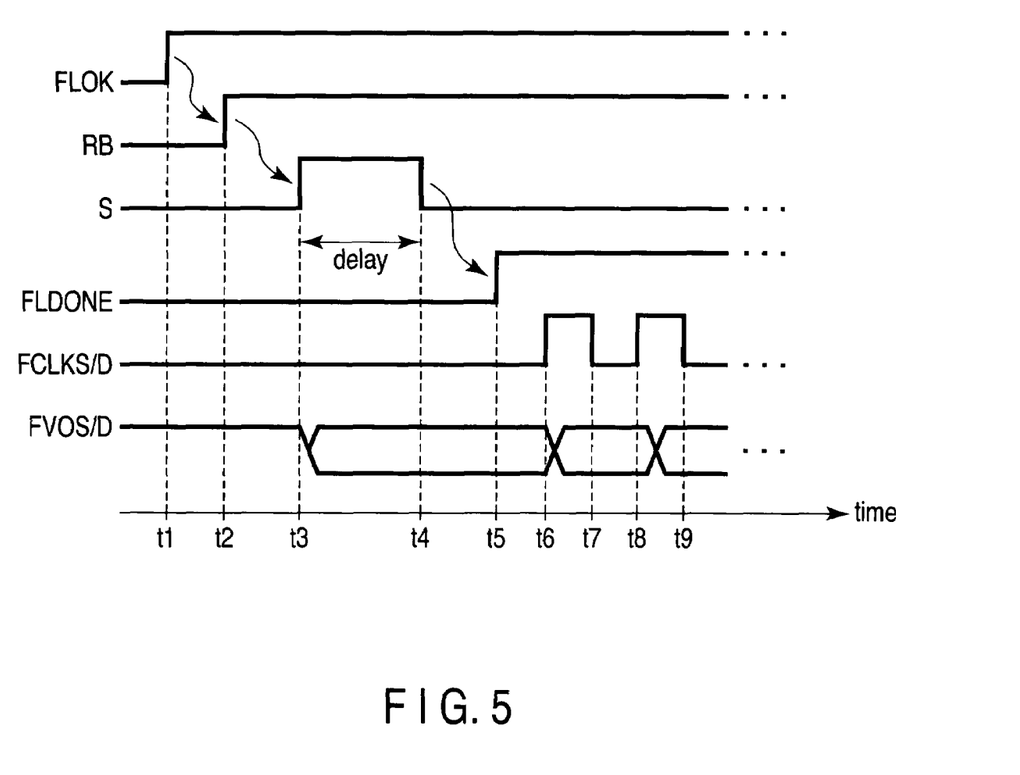
FIG. 5 is a timing chart showing the operation of the fuse latch circuit according to the first embodiment.

As shown in FIG. 5, first at time t1, the level of a signal FLOK from the control circuit 15 rises from the low level to the high level, and the reset state is canceled.

Subsequently, at time t3, when the level of the input sections (S) of the flip-flops Fl to Fn rises from the low level to the high level, a leading head bit of the output signal FVOS/D is output to the control circuit 15.

Subsequently, at time t5 later than time t4 which is the time after an elapse of a predetermined delay time from time t3, and at which the level of the input section (S) falls from the high level to the low level, the level of the output signal (FLDONE) of the fuse latch circuit 12 rises from the low level to the high level.

Finally, at timings of the time (t6, t8, ...) at which the input signal FCLKS/D from the control circuit 15 rises, the output signal FVOS/D is output to the control circuit.

<2. Redundancy Operation>

Next, a redundancy operation of the fuse box 11 according to this embodiment will be described below in accordance with the timing chart of FIG. 6.

Figure 6:
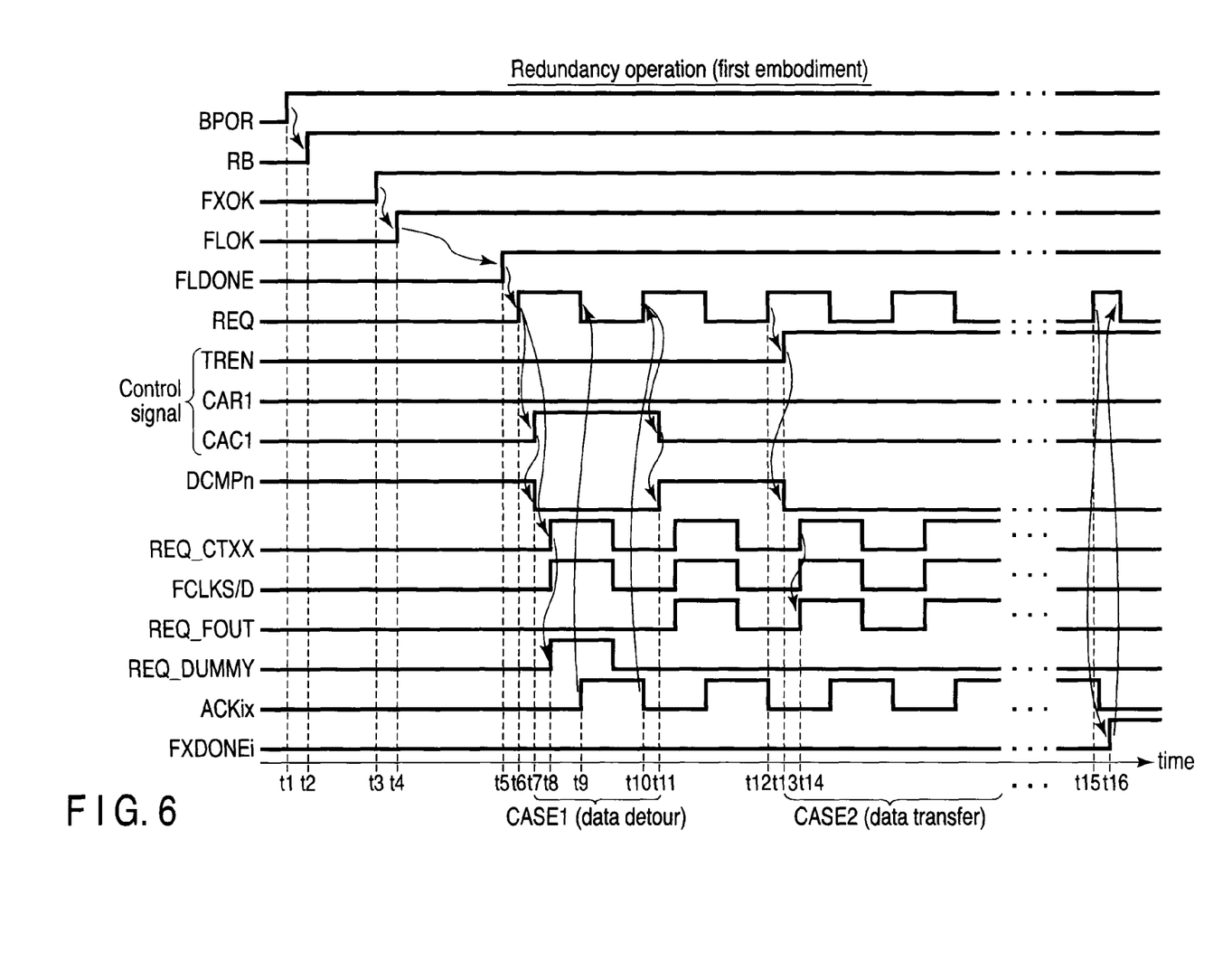
FIG. 6 is a timing chart showing the redundancy operation of the semiconductor integrated circuit device according to the first embodiment.

As shown in FIG. 6, first, the signal BPOR transmitted from the memory macro rises from the low level to the high level at time t1, thereafter, at time t2, the signal RB rises from the low level to the high level. The fuse counter circuit 13 which has been in the reset state until now is brought into the normal state.

Subsequently, at time t3, the signal FXOK rises from the low level to the high level, whereby the operation of the fuse box 11 is started.

Subsequently, at time t4, the signal FLOK rises from the low level to the high level, the fuse data is read in the fuse latch circuit 12, and the data is held in the fuse latch circuit 12.

Subsequently, at time t5, the signal FLDONE from the fuse latch circuit 12 is raised from the low level to the high level.

Then, subsequently, at time t6, the signal REQ rises from the low level to the high level, and transfer of the fuse data is started. First, the counted number in the fuse counter circuit 13 is increased by one by the signal REQ, and as a result of this, at time t8, the signal REQ is output as it is as a signal REQ_CTXX.

Subsequently, at time t7, the high/low levels of the control signals TREN, CAR1, and CAC1 are determined in accordance with the counted number in the fuse counter circuit 13.

2-1. CASE 1 (Case where Fuse Data is Transferred to Detour Data Path)

Here, the case where at time t7, the control signal TREN and the control signal CAR1 are at the low level, and the control signal CAC1 is at the high level will be examined. In this case, the fuse data is not transferred from the transmitter circuit 16 to the memory macro (not shown), and passes through the detour data path.

At time t7, the signal DCMPn falls to the low level.

Subsequently, at time t8, as the clock signal FCLKS/D of the fuse latch circuit 12, the signal REQ_CTXX obtained by delaying the signal REQ_CT by the delay circuit is transmitted. However, as the signal REQ_FOUT to be transmitted to the transmitter circuit 16, the signal REQ_CTXX is not transmitted because the control signal CAC1 is at the high level, and the level of the signal REQ_FOUT is fixed to the low level.

On the other hand, at time t8, the signal REQ_CTXX is transmitted to the signal REQ_DUMMY, low data is changed into asynchronous data by the dummy transmitter circuit 19 (pseudo-transmitter circuit), the signal ACKix for requesting the next fuse data is generated, and the request signal REQ is operated.

That is, subsequently, at time t10, when the level of the signal ACKix as the signal for requesting the next fuse data lowers from the high level to the low level, the signal REQ is raised from the low level to the high level. Thus, the counted number in the fuse counter circuit 13 is increased by one by the signal REQ, and the same operation as above is repeated.

As described in CASE 1, by using such a detour data path, it is possible, even when the fuse data is not transferred, to generate the signal ACKix for requesting the next fuse data, and operate the request signal REQ.

2-2. CASE 2 (Case where Transfer of Fuse Data is Performed)

Subsequently, the case where at time t13, the control signal TREN is at the high level, and the control signals CAR1 and CAC1 are at the low level is examined. In this case, the fuse data FOUTS/D <0> and FOUTS/D <1> do not pass through the detour data path, and are transferred from the transmitter circuit 16 to the memory macro (not shown).

First, at time t12, the level of the signal REQ rises from the low level to the high level, whereby the counted number in the fuse counter circuit 13 is increased by one, and the signal REQ is output as it is as the signal REQ_CT.

Subsequently, at time t13, the level of the control signal is rises to the high level, and the signal DCMPn is lowered to the low level.

Subsequently, at time t14, the signal REQ_FOUT to be transmitted to the transmitter circuit 16, and the clock signal FCLKS/D of the fuse latch circuit 12 are transmitted as the signal REQ_CTXX obtained by delaying the signal REQ_CT by the delay circuit. As a result of this, the fuse data is transmitted to the memory macro as asynchronous data, i.e., as the signals FOUTS/D <0> and FOUTS/D <1>.

The transmitted fuse data FOUTS/D <0> and FOUTS/D <1> are received by the memory macro (receiving circuit side), predetermined data of the memory macro is replaced with the fuse data FOUTS/D <0> and FOUTS/D <1>, and the predetermined data of the memory macro have a redundancy. Subsequently, the memory macro transmits a signal ACKS/D requesting the next fuse data to the fuse box. Upon receipt of the request signal ACKS/D, the control circuit 15 performs transfer of the next fuse data by the signal REQ again.

As described above, an operation of successively transferring the fuse data or transferring the data not through the detour data path (detouring the data) is repeated. Further, when the number of transfers counted by the fuse counter circuit 13 reaches a predetermined value, the transfer of the fuse data is terminated, and the redundancy operation is terminated.

For example, if the number of transfers counted by the fuse counter circuit 13 reaches a predetermined value at time t15, the signal FXDONEi and the signal FXDONE are raised from the low level to the high level.

Subsequently, at time t16, the signal REQ is fixed to the low level, the transfer of the fuse data is terminated, and the redundancy operation is terminated.

<3. Effect of this Embodiment>

According to the semiconductor integrated circuit device, the redundancy system, and the redundancy method of this embodiment, at least the following four effects (1) to (4) can be obtained.

(1) It is possible to perform the detour operation of fuse data in which transfer of fuse data is performed, but transfer (data output) of fuse data from the fuse box to the outside is not performed, and improve the convenience.

As described above, the fuse box 11 according to this example is provided with a control circuit 15 including a detour data path circuit 17 which when the fuse data is not transferred, does not transfer the fuse data to the outside, and forms a detour data path for detouring the fuse data in the circuit 17 itself.

Thus, upon receipt of the control signal TREN, CAR1, CAC1 transmitted from the fuse counter circuit 13, the detour data path circuit 17 outputs the signal ACKix to the fuse counter circuit 13 as the signal for requesting the next fuse data, to operate the signal (CASE 1: time t7 to time t10)

Thus, it is possible to operate the request signal REQ for requesting the next fuse data without successively transferring the fuse data to the memory macro (outside) (CASE 1: time t10). As a result of this, it is possible to perform the detour operation of fuse data in which transfer of fuse data from the fuse latch circuit 12 is performed, but transfer of fuse data from the fuse box 11 to the memory macro (outside) is not performed, which is advantageous in the point that the convenience can be improved.

Figure 10:
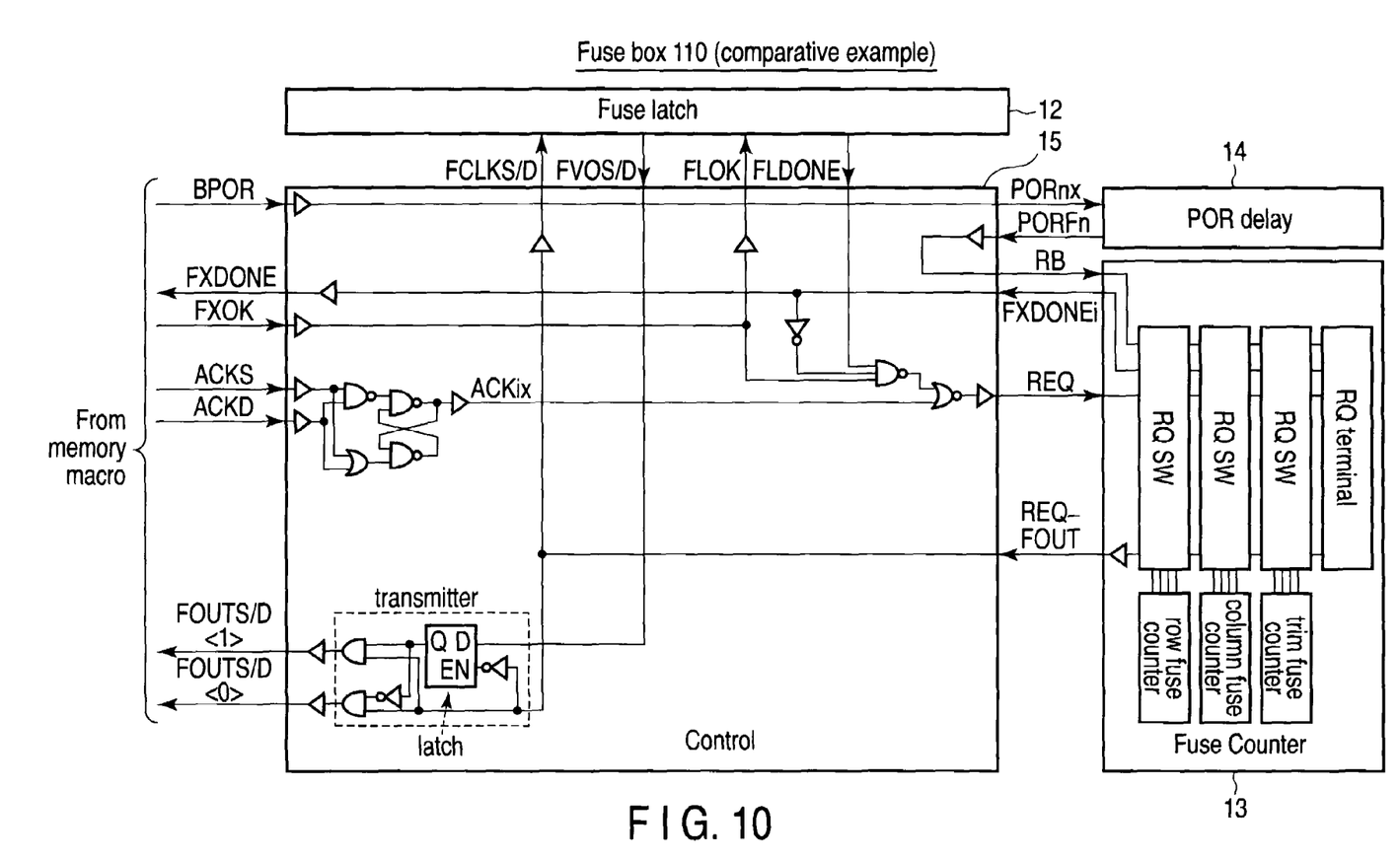
FIG. 10 is a diagram showing an example of an overall configuration of a semiconductor integrated circuit device according to a comparative example.

Further, in the fuse box 110 according to the comparative example to be described later, such a detour data path circuit 17 is not provided, the request signal for requesting the next fuse data is received by outputting fuse data from the fuse box. Therefore, the convenience is reduced.

(2) It is advantageous to employ the semiconductor integrated circuit device, the redundancy system, and the redundancy method of this embodiment to reduction in circuit size.

As described previously in the redundancy operation of the fuse box 11 of this example, in the operation (time t6 to time t8, and time t12 to time t14) from receiving the request signal REQ up to transmitting the fuse data from the fuse latch circuit 12, the common circuits (fuse latch circuit 12, delay circuit 14, fuse counter circuit 13, and a part of control circuit 15) can be used in both the case (CASE 2) where the fuse data is transferred, and the case (CASE 1) where the fuse data is not transferred, and the data is passed through the detour data path. Thus, the size of the circuit of the fuse box 11 can be made small, which is advantageous to reduction in the circuit size.

(3) The operation cycle in the case where the data is transferred, and that in the case where the data is not transferred can be made closer to each other.

Further, in the configuration of this example, as described above, the common circuits (fuse latch circuit 12, delay circuit 14, fuse counter circuit 13, and a part of control circuit 15) can be used in both the case (CASE 2) where the fuse data is transferred, and the case (CASE 1) where the fuse data is not transferred, therefore the data is passed through the detour data path. Thus, the delay of a signal passed through the detour data path is controlled by the delay circuit 20, whereby the operation cycle of the fuse box in the case where the data is transferred, and that in the case where the data is not transferred can be made closer to each other.

(4) Lacing control of signals can be made easier.

Further, in this example, the control signals TREN, CAR1, and CAC1 are output from the fuse counter circuit 13. Further, by virtue of the fact that after the control in the control circuit 15 is performed by the control signals TREN, CAR1, and CAC1, and the signal formed by delaying the request signal REQ can perform a function of the operation clock of the control circuit 15, the lacing control of the signals can be made easy.

Second Embodiment

Other Configuration Examples of Fuse Box

Next, a semiconductor integrated circuit device according to a second embodiment will be described below with reference to FIGS. 7 to 9. This embodiment relates to the other configuration examples of the fuse box. In this description, detailed description of parts overlapping the first embodiment will be omitted.

<Overall Configuration Example>

Figure 7:
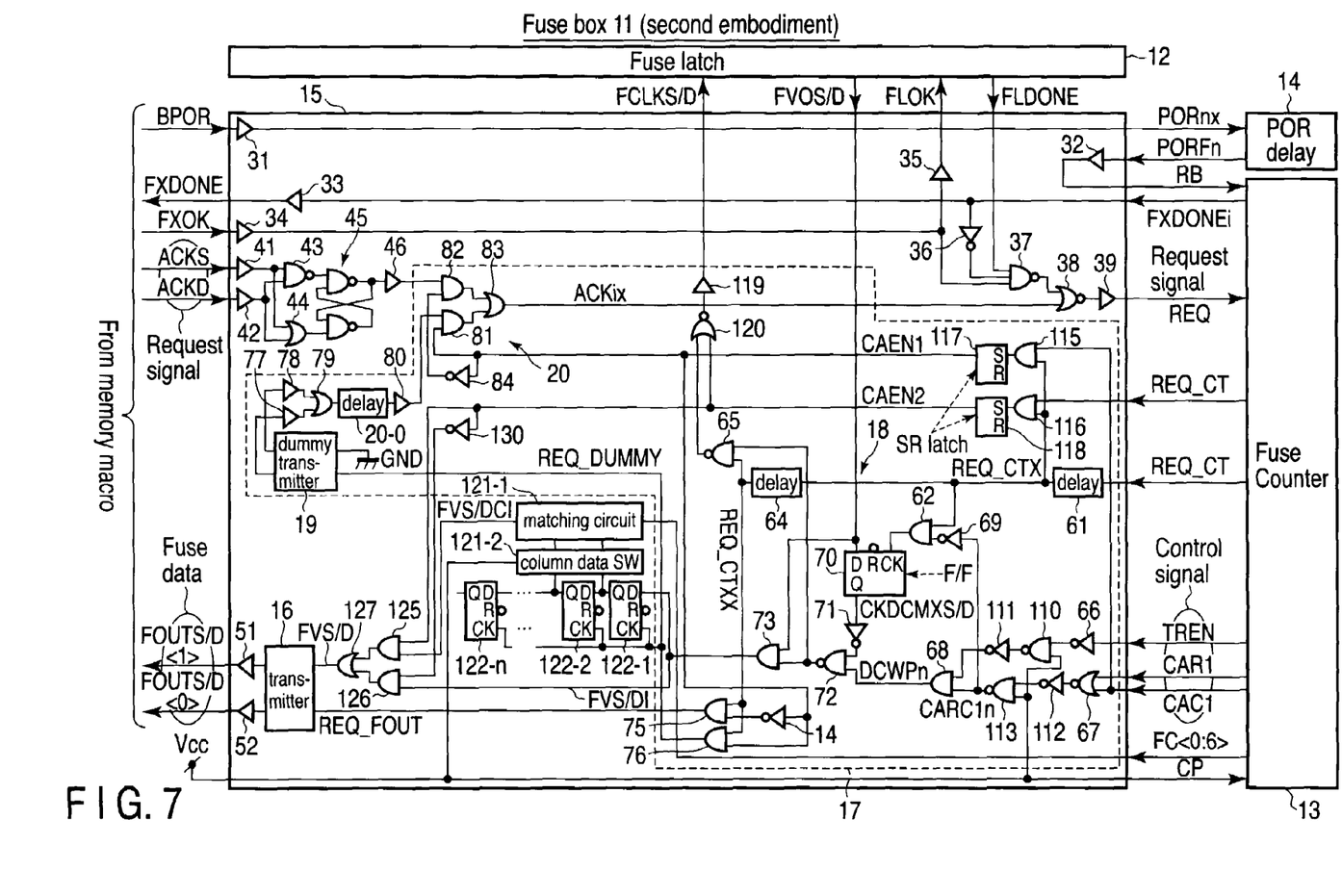
FIG. 7 is a diagram showing an example of an overall configuration of a semiconductor integrated circuit device according to a second embodiment.

As shown in FIG. 7, the configuration of the semiconductor integrated circuit device according to this example differs from the first embodiment in the following points.

That is, input sections of a NAND gate 110 is connected to an output section of an inverter 66, and the internal power source Vcc, and an output section thereof is connected to an input section of an inverter 111.

An output section of the inverter 111 is connected to an input section of an AND gate 68.

An input section of an inverter 112 is connected to an output section of a NOR gate 67, and an output section thereof is connected to an input section of a NAND gate 113.

An input section of the NAND gate 113 is connected to the internal power source Vcc, and an output section thereof is connected to an input section (signal CARCIn) of the AND gate 68.

Input sections of an AND gate 115 are connected to a control signal CAC1 and an output section (REQ_CTX) of a delay circuit 61, and an output section thereof is connected to an input section S of a flip-flop 117.

An input section of an AND gate 116 is connected to the output section of the delay circuit 61, and an output section thereof is connected to an input section S of a flip-flop 118.

Input sections of a NOR gate 120 are connected to an output section of the flip-flop 118, and an output section of a NAND gate 65, and an output section thereof is connected to an input section of a buffer 119.

An output section of the buffer 119 is connected to an input section (FCLKS/D) of a fuse latch circuit 12.

An input section of a matching circuit 121-1 is connected to an output section (FC <0:6>) of a fuse counter circuit 13, and an output section thereof is connected to an input section (FVS/DCI) of an AND gate 125.

Input sections of a column data switch 121-2 are connected to output sections Q of a plurality of flip-flops 122-$l$ to 122-$n$, and output sections thereof are connected to input sections of the matching circuit 121-1.

Input sections (clock CK) of the plural flip-flops 122-$l$ to 122-$n$ are common-connected to an output section (REQ_DUMMY) of the AND gate 76, and their input sections (input data D) and output sections (output data Q) are connected in series.

An input section of an AND gate 125 is connected to an output section of the flip-flop 118, and an output section thereof is connected to an input section of an OR gate 127.

Input sections of an AND gate 126 are connected to an output section of an inverter 130, and an output section of an AND gate 73, and an output section thereof is connected to an input section of the OR gate 127.

An input section of an inverter 130 is connected to the output section of the flip-flop 118.

Configuration Example of Fuse Counter Circuit

Next, a configuration example of the fuse counter circuit 13 will be described below with reference to FIG. 8.

Figure 8:
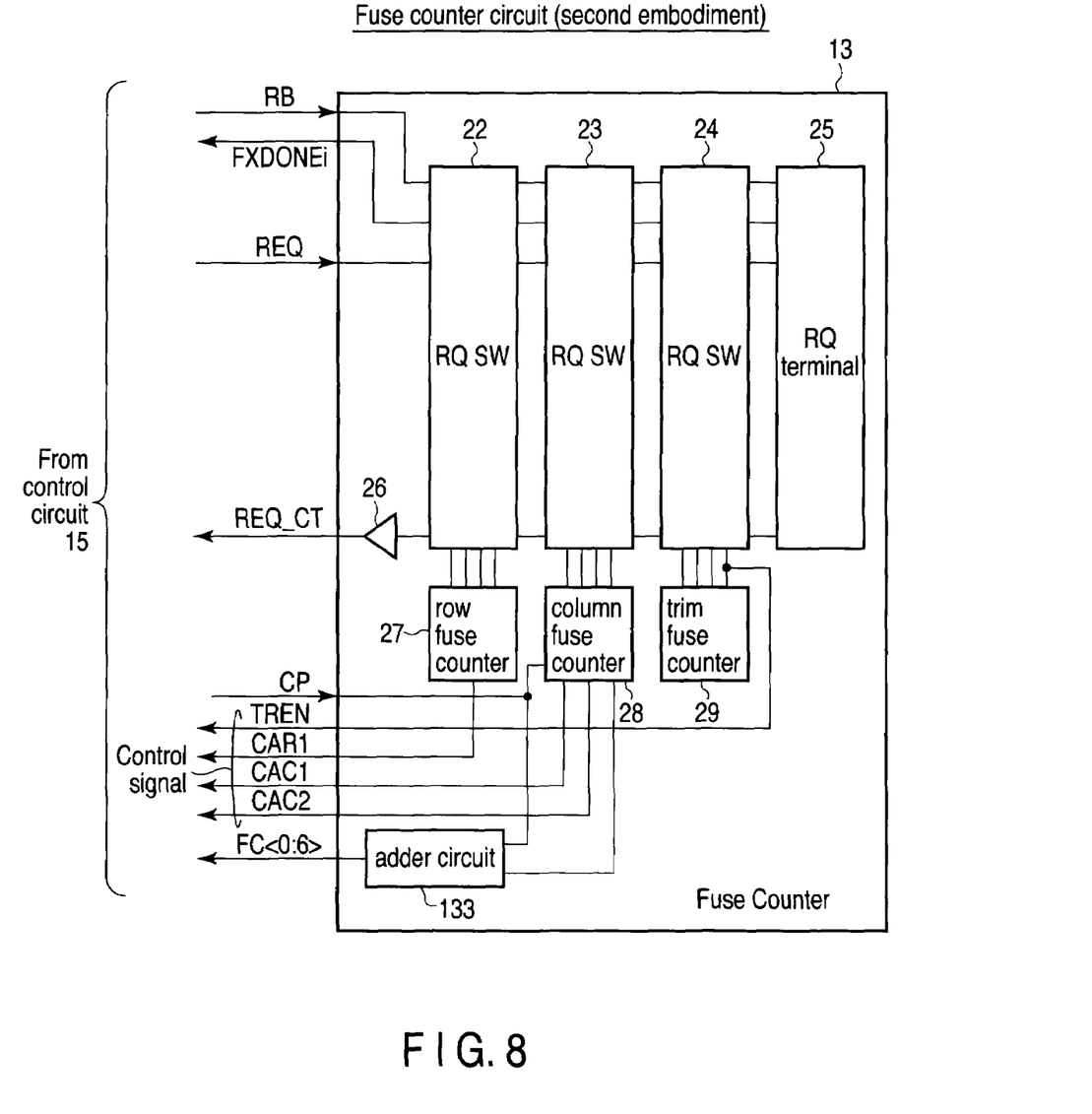
FIG. 8 is a diagram showing an example of a configuration of a fuse counter circuit according to the second embodiment.

As shown in FIG. 8, the fuse counter circuit 13 of this example differs from that of the first embodiment in the following points.

First, the fuse counter circuit of this example is further provided with an adder circuit 133. Input sections of the adder circuit 133 are connected to output sections of the column fuse counter 28, and the internal power source Vcc, and an output section thereof is connected to an input section (FC <0:6>) of the control circuit 15. Further, the column fuse counter 28 further outputs the control signal CAC2.

<Redundancy Operation>

Next, the redundancy operation of the semiconductor integrated circuit device according to this example will be described below in accordance with FIG. 9.

Figure 9:
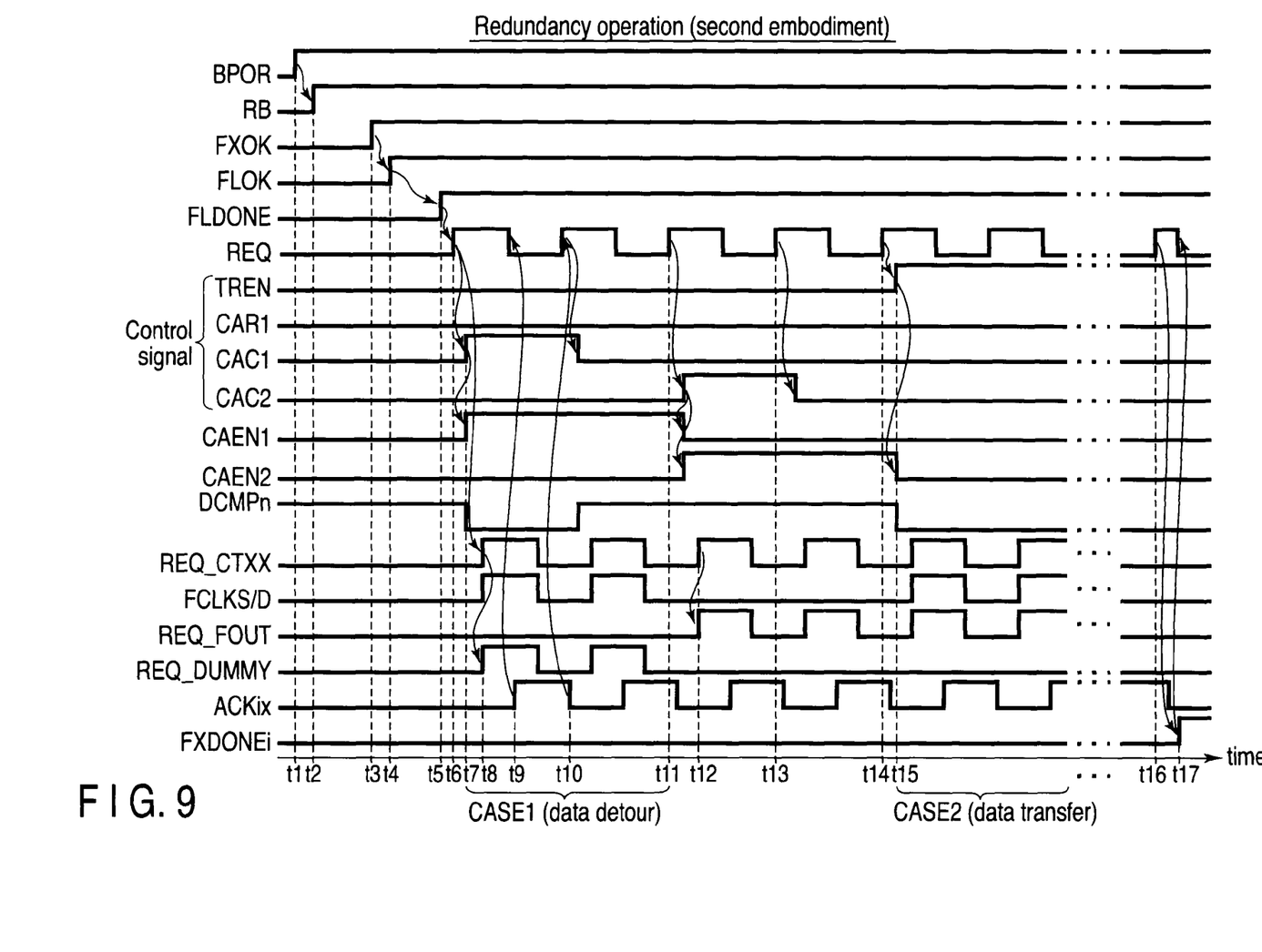
FIG. 9 is a timing chart showing the redundancy operation of the semiconductor integrated circuit device according to the second embodiment.

As shown in FIG. 9, like the first embodiment described above, at time t1, and time t2, the signals BPOR and RB successively rise from the low level to the high level.

Subsequently, at time t3, and time t4, the signals FXOK and FLOK successively rise from the low level to the high level, whereby the operation of the fuse box 11 is started.

Subsequently, at time t5, the signal FLDONE rises from the low level to the high level.

Subsequently, at time t6, the signal REQ rises from the low level to the high level, and transfer of fuse data starts. This signal REQ is input, whereby the counted number in the fuse counter circuit 13 is increased by one, and the signal REQ is output as it is as the signal REQ_CT.

Simultaneously with the above, the high/low levels of the control signals TREN, CAR1, CAC1, and CAC2 are determined in accordance with the counted number in the fuse counter circuit.

CASE 1 (Case where Transfer of Fuse Data is not Performed, and Detour Data Path is Used)

Subsequently, the case where at time t7, the control signals TREN, CAR1, and CAC2 are at the low level, and the control signal CAC1 is at the high level will be examined. In this case, fuse data is not transferred from the transmitter circuit 16 to the memory macro (not shown), and the data is passed through the detour data path.

At this time t7, the signal DCMPn falls to the low level, the signal CAEN1 rises to the high level, the signal CAEN2 remains at the low level, and as the clock signal FCLKS/D of the fuse latch circuit, the signal REQ_CTXX obtained by delaying the signal REQ_CT by the delay circuit is transmitted. Here, as the signal REQ_FOUT to be transmitted to the fuse data transmitter circuit, the signal REQ_CTXX is not transmitted because the control signal CAC1 is at the high level, and the level of the signal REQ_FOUT is fixed to the low level.

On the other hand, at time t8 and later, the signal REQ_CTXX is transmitted to the signal REQ_DUMMY, data is changed into asynchronous data by the dummy transmitter circuit (pseudo-transmitter circuit) 19, the signal ACKix for requesting the next fuse data is generated, and the request signal REQ is operated.

By using the detour data path described above, it is possible to request the next fuse data even when fuse data is not transferred.

Subsequently, at time t10, when the request signal ACKS/D is received from the memory macro, transfer of the next fuse data is performed by using the signal REQ again. This operation is repeated.

CASE 2 (Case where Data Transfer is Performed)

Subsequently, the case where at time t15, the control signal TREN is at the high level, and the control signals CAR1, CAC1, and CAC2 are at the low level will be examined. In this case, the fuse data items FOUTS/D <0> and FOUTS/D <1> are not passed through the detour data path, and are transferred from the transmitter circuit 16 to the memory macro (not shown).

First, at time t14, the signal REQ is switched from the low level to the high level.

Subsequently, at time t15, when the control signal TREN is switched from the low level to the high level, the signals DCMPn and CAEN2 fall to the low level, while CAEN1 remains at a low level. Thus, as the signal REQ_FOUT to be transmitted to the transmitter circuit 16, and the clock signal FCLKS/D of the fuse latch circuit, the signal REQ_CTXX obtained by delaying the signal REQ_CT by using the delay circuit is transmitted. Further, fuse data is transmitted as asynchronous data, i.e., the signals FOUTS/D <0 >and FOUTS/D <1 >to the memory macro (not shown).

The transmitted fuse data is received by the memory macro side, predetermined data of the memory macro is replaced with the fuse data FOUTS/D <0> and FOUTS/D <1>, and the predetermined data of the memory macro have a redundancy. Subsequently, the memory macro transmits the next fuse data request signal ACKS/D to the fuse box 11 again. Upon receipt of the request signal ACKS/D, the control circuit 15 performs transfer of the next fuse data by using the signal REQ.

Successively transferring fuse data as described above or not transferring fuse data through the detour data path (detouring the data) is repeated. Further, when the number of transfers counted in the fuse counter circuit 13 reaches a certain predetermined value, the transfer of the fuse data is terminated, and the redundancy operation is also terminated.

For example, at time t16, when the number of transfers counted by the fuse counter circuit 13 reaches a certain predetermined value, the signals FXDONEi and FXDONE are raised from the low level to the high level.

Subsequently, at time t17, the signal REQ is fixed to the low level, transfer of the fuse data is terminated, and the redundancy operation is terminated.

<Effect According to this Embodiment>

As described above, according to the semiconductor integrated circuit device, the redundancy system, and the redundancy method thereof, at least the same effects as those described in the items (1) to (4) can be obtained. Further, the configuration described in this example can be applied as the need arises.

COMPARATIVE EXAMPLE

Example in which Detour Data Path Circuit is not Provided

In order to compare with the first and second embodiments, a semiconductor integrated circuit device according to a comparative example will be described below with reference to FIG. 10. This embodiment relates to an example provided with no detour data path circuit. In the description, detailed description of parts overlapping the first embodiment will be omitted.

As shown in FIG. 10, a fuse box according to the comparative example is constituted of a fuse latch circuit 12 including a fuse and a circuit for latching fuse data, a fuse counter circuit 13 for counting the number of transfers of fuse data, and a control circuit 15 for controlling a signal of fuse data. However, the fuse box according to the comparative example differs from the above-mentioned embodiments in not including the detour data path circuit 17 described in the embodiments.

<Redundancy Operation>

The redundancy operation of the fuse box according to this comparative example is as follows.

That is, first, the signal BPOR rises from the low level to the high level, whereby the signal RB rises from the low level to the high level, and the fuse counter circuit 13 which has been in the reset state is brought into the normal state.

Subsequently, the signal FXOK rises from the low level to the high level, whereby the operation of the fuse box is started. At this time, the signal FLOK rises from the low level to the high level, fuse data is read in the fuse latch circuit, and the data is held in the fuse latch circuit, and the signal FLDONE is raised from the low level to the high level.

Then, the signal REQ rises from the low level to the high level, and transfer of fuse data starts. First, the counted number in the fuse counter circuit is increased by one by the signal REQ, and the signal REQ is output as it is as the signal REQ_FOUT.

The signal REQ_FOUT is transmitted as the clock signal FCLKS/D of the fuse latch circuit and, at the same time, is transmitted to the fuse data transmitter circuit. Further, fuse data is transmitted as asynchronous data, i.e., as the signals FOUTS/D <0> and FOUTS/D <1>.

The transmitted fuse data is received by the receiving circuit side, and the next fuse data request signals ACKS, and ACKD are transmitted. Upon receipt of the request signal, the control circuit performs transfer of the next fuse data by using the signal REQ again. By the repetition of the above operation, fuse data is successively transmitted and, when the number of transfers counted in the fuse counter circuit reaches a certain predetermined value, the signals FXDONEi and FXDONE are raised from the low level to the high level, and the signal REQ is fixed to the low level, whereby the transfer of fuse data is terminated.

With the configuration of the fuse box 110 according to the comparative example, in the redundancy operation, unless fuse data is transmitted as the asynchronous data, i.e., the signals FOUTS/D <0> and FOUTS/D <1> without fail, the next fuse data request signals ACKS and ACKD cannot be operated. Thus, the detour operation of the fuse data cannot be performed in which transfer of fuse data from the fuse latch circuit 12 is performed, but transfer of fuse data from the fuse box 110 is not performed, which reduces the convenience.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
    a fuse latch circuit including a fuse and a latch circuit for latching fuse data held in the fuse;
    a fuse counter circuit for counting a number of transfers of the fuse data, the number of transfers counted by the fuse counter circuit implying the number of transfers of fuse data transmitted from the fuse latch circuit; and
    a control circuit including a transmitter circuit for transmitting the fuse data to a memory macro connected to the control circuit, and a detour data path circuit which when the fuse data is not transferred, does not transfer the fuse data to the memory macro, and forms a detour data path for detouring the fuse data in the detour data path circuit itself.

2. The device according to claim 1, wherein upon receipt of a control signal transmitted from the fuse counter circuit, the detour data path circuit causes the fuse counter circuit to operate a request signal for requesting the next fuse data from the fuse latch circuit.

3. The device according to claim 1, further comprising a delay circuit for switching the fuse counter circuit which has been in a reset state to a normal state in order to start transfer of the fuse data.

4. The device according to claim 2, wherein the detour data path circuit includes
    a delay circuit for operating the request signal;
    a dummy transmitter circuit output sections of which are connected to the delay circuit, and which has the same configuration as the transmitter circuit; and
    a switching circuit, an input section of which is connected to the fuse counter circuit, and which when a control signal is input, outputs the fuse data transmitted from the fuse latch circuit to the dummy transmitter circuit by switching the transmitting from the transmitter circuit to the dummy transmitter circuit.

5. The device according to claim 2, wherein the fuse counter circuit includes a plurality of fuse counters for generating the control signal.

6. The device according to claim 5, wherein the fuse counter circuit is further provided with an adder circuit, an input section of which is connected to one of output sections of the plural fuse counters, and an output section of which is connected to an input section of the control circuit.

7. A redundancy system comprising:
    a fuse box provided with a fuse latch circuit including a fuse and a latch circuit for latching fuse data held in the fuse, a fuse counter circuit for counting a number of transfers of the fuse data, the number of transfers counted by the fuse counter circuit implying the number of transfers of fuse data transmitted from the fuse latch circuit, and
    a control circuit including a transmitter circuit for transmitting the fuse data to a memory macro connected to the control circuit, and a detour data path circuit which when the fuse data is not transferred, does not transfer the fuse data to the memory macro, and forms a detour data path for detouring the fuse data in the detour data path circuit itself,
    the memory macro replacing existing data thereof with the fuse data transmitted from the fuse box to thereby have a redundancy of the data of the memory macro's own.

8. The redundancy system according to claim 7, wherein upon receipt of a control signal transmitted from the fuse counter circuit, the detour data path circuit causes the fuse counter circuit to operate a request signal for requesting the next fuse data from the fuse latch circuit.

9. The redundancy system according to claim 7, wherein the fuse box further includes a delay circuit for switching the fuse counter circuit which has been in a reset state to a normal state in order to start transfer of the fuse data.

10. The redundancy system according to claim 7, wherein the detour data path circuit includes
  a delay circuit for operating a request signal;
  a dummy transmitter circuit, output sections of which are connected to the delay circuit, and which has the same configuration as the transmitter circuit; and
  a switching circuit, an input section of which is connected to the fuse counter circuit, and which when a control signal is input, outputs the fuse data transmitted from the fuse latch circuit to the dummy transmitter circuit by switching the transmitting from the transmitter circuit to the dummy transmitter circuit.

11. The redundancy system according to claim 8, wherein the fuse counter circuit includes a plurality of fuse counters for generating the control signal.

12. The redundancy system according to claim 11, wherein the fuse counter circuit is further provided with an adder circuit, an input section of which is connected to one of output sections of the plural fuse counters, and an output section of which is connected to an input section of the control circuit.

13. A redundancy method of a redundancy system comprising:
  reading fuse data in a fuse latch circuit, and holding the data in the fuse latch circuit;
  increasing a counted number in a fuse counter circuit by one;
  causing the fuse counter circuit to output a first control signal in a first state when fuse data is to be transferred to a detour data path in a control circuit;
  causing the control circuit, when the first control signal in the first state is received, to pass the fuse data through the detour data path without transferring the fuse data to a memory macro;
  causing the control circuit to make the fuse counter circuit operate a first request signal for requesting the next fuse data from the fuse latch circuit; and
  causing the fuse counter circuit to increase the counted number in the fuse counter circuit by one by the first request signal.

14. The redundancy method according to claim 13, further comprising:
  causing the fuse counter circuit, when transfer of the fuse data to the memory macro is performed, to output a second control signal in a second state to the control circuit;
  causing the control circuit, when the second control signal in the second state is received, to transfer the fuse data to the memory macro without passing the fuse data through the detour data path;
  increasing the counted number in the fuse counter circuit by one; and
  causing the memory macro to receive the transmitted fuse data, replace data of the memory macro with the fuse data, and have a redundancy of the data of the memory macro's own.

15. The redundancy method according to claim 14, further comprising:
  causing the memory macro to transmit a second request signal for requesting the next fuse data to a fuse box; and
  causing the control circuit, when the second request signal is received, to transmit a third request signal again to the fuse counter circuit, and perform transfer of the next fuse data to the memory macro.

16. The redundancy method according to claim 15, further comprising:
  repeating transfer of the fuse data, or no transfer of the fuse data through the detour data path; and
  terminating transfer of the fuse data, and terminating the redundancy operation when the number of transfers counted in the fuse counter circuit reaches a predetermined number.

17. The redundancy method according to claim 13, wherein the redundancy system comprises a fuse box provided with the fuse latch circuit including a fuse and a latch circuit for latching fuse data held in the fuse, the fuse counter circuit for counting the number of transfers of the fuse data, the number of transfers counted by the fuse counter circuit implying the number of transfers of fuse data transmitted from the fuse latch circuit, and the control circuit including a transmitter circuit for transmitting the fuse data to the memory macro, and a detour data path circuit which when the fuse data is not transferred, does not transfer the fuse data to the memory macro, and forms the detour data path for detouring the fuse data in the detour data path circuit itself.

* * * * *